US005610433A

United States Patent [19]

Merrill et al.

[11] Patent Number: 5,610,433

[45] Date of Patent: Mar. 11, 1997

[54] MULTI-TURN, MULTI-LEVEL IC INDUCTOR WITH CROSSOVERS

[75] Inventors: Richard B. Merrill, Daly City; Enayet U. Issaq, San Jose, both of Calif.

[73] Assignee: National Semiconductor Corporation, Santa Clara, Calif.

[21] Appl. No.: 404,019

[22] Filed: Mar. 13, 1995

[51] Int. Cl.[6] .............................. H01F 5/04; H05K 1/16; H01L 27/01

[52] U.S. Cl. .......................... 257/531; 336/200; 336/232

[58] Field of Search ............................ 257/531; 336/200, 336/232

[56] References Cited

U.S. PATENT DOCUMENTS

| | | | |
|---|---|---|---|
| 4,313,152 | 1/1982 | Vranken | 336/200 |
| 5,095,357 | 3/1992 | Andoh et al. | 257/531 |
| 5,157,576 | 10/1992 | Takaya et al. | 257/531 |
| 5,227,659 | 7/1993 | Hubbard | 257/531 |

*Primary Examiner*—William D. Larkins
*Attorney, Agent, or Firm*—Skjerven, Morrill, MacPherson, Franklin & Friel; Brian D. Ogonowsky

[57] ABSTRACT

A high value inductor with a high Q factor is formed using integrated circuit techniques to have a plurality of layers, where each layer has formed on it two or more coils. The coils in the various layers are interconnected in series. Although the resulting inductor exhibits a relatively high resistance, the number of coil turns is large. Since inductance increases in proportion to the square of the number of coil turns, the resulting inductor has a very high Q factor. A cross-over arrangement located in one level provides compact connections between turns in a different level.

4 Claims, 7 Drawing Sheets

MULTI-TURN, MULTI-LEVEL IC INDUCTOR WITH CROSSOVERS

FIELD OF THE INVENTION

This invention relates to inductors and, in particular, to an inductor formed using integrated circuit processing techniques.

BACKGROUND OF THE INVENTION

Inductors are frequently formed in integrated circuits; however, given the inherent limitations of integrated circuit technology, it is difficult to form a high value inductor.

An inductor is generally created by forming a conductive coil around a core. The core may be an insulator or a magnetic core. Magnetic cores result in greater inductance values but are impractical to form in many types of integrated circuit. The inductance value is also greatly affected by the number of turns of the coil, where the inductance value is proportional to the square of the number of turns of the coil. Inductance value is also affected to a lesser extent by the radius of the coil and other well known factors.

Various methods have been used in an attempt to obtain high inductance values. Two such methods are described in U.S. Pat. No. 5,227,659 by Hubbard, and U.S. Pat. No. 5,095,357 by Andoh, et al, both patents incorporated herein by reference. In the '357 patent, it is disclosed that a high value inductor may be formed by two substantially flat spirals of metal, either arranged side-by-side or separated by an insulating layer, where an end of one flat spiral is connected to an end of the other flat spiral using an interconnection layer. Such a technique has certain drawbacks. One of the drawbacks is that the substantial length of the flat spirals may result in some destructive interference, due to phase opposition, in high frequency signals through the spiral. Another drawback is that the interconnection layer requires the formation of additional insulating layers and metal layers yet adds little or nothing to the inductance value.

In the '659 patent by Hubbard, a single, multi-level coil is described, where one coil turn is provided at each level. Hence, the inductors described in the '659 patent are limited to relatively few coil turns.

For most applications of an inductor, such as in a resonant circuit (also known as a tank circuit), the Q, or quality, factor of the inductor is important. The Q factor is the ratio of the reactance (X) of the inductor at a given frequency (f) to its DC resistance. The reactance of an inductor of value L is equal to $2\pi fL$.

Accordingly, it is desirable to improve upon the existing inductors formed using integrated circuit techniques to obtain a high value inductor with a high Q factor.

SUMMARY OF THE INVENTION

A high value inductor with a high Q factor is formed using integrated circuit techniques to have a plurality of layers, where each layer has formed on it two or more coils. The coils in the various layers are interconnected in series. Although the resulting inductor exhibits a relatively high resistance, the number of coil turns is large. Since inductance increases in proportion to the square of the number of coil turns, the resulting inductor has a very high Q factor.

DETAILED DESCRIPTION OF THE PREFERRED EMBODIMENTS

Figure 1:
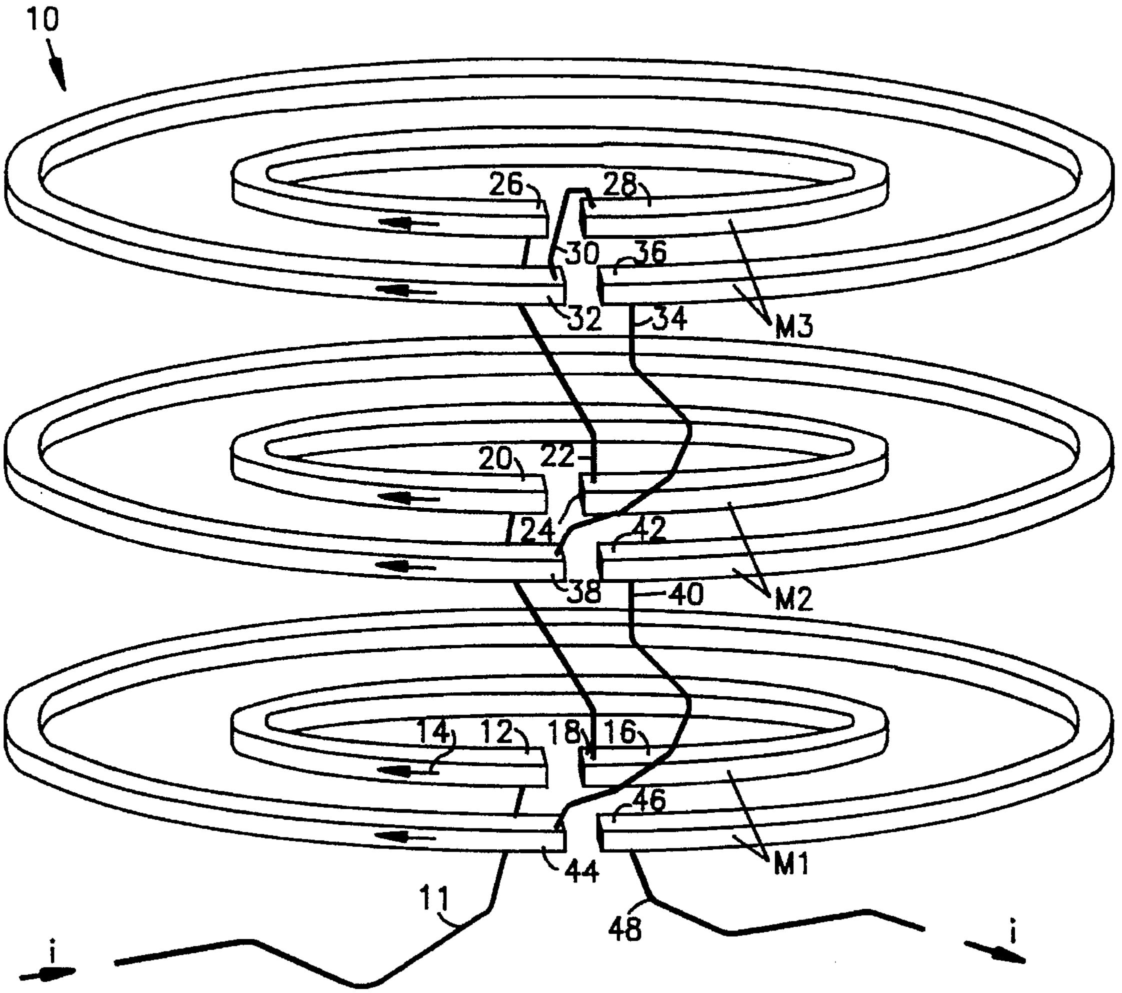
FIG. 1 is a simplified perspective view of a three-layer embodiment of the inductor with two coils per layer.

FIG. 1 illustrates a high value inductor 10 formed using three layers of insulation with two metal coils per layer. The coils may have a diameter of anywhere between a few tens of microns to a few thousand microns. The metal may be aluminum or other highly conductive material. The interconnections between the metal coils on different levels are shown as wires for simplicity, but in actuality the interconnections are formed using conductive vias extending through the insulating layers. The formation of vias is well known in the art. The separation between each layer is exaggerated to better illustrate the structure.

In the embodiment shown in FIG. 1, a current i is supplied by an input lead 11 to a first end 12 of an inner coil m1. The designation m1 connotes a first metal layer. The direction of this current i through each of the metal coils is shown by an arrow, such as arrow 14. It is important to note that the direction of current through all the coils is the same. This increases the inductance value of inductor 10 and avoids destructive interference of the signal as the current flows through the coils.

A conductive via 16 connects a second end 18 of inner coil m1 to a first end 20 of inner coil m2, overlying and insulated from inner coil m1. A second conductive via 22 connects a second end 24 of inner coil m2 to a first end 26 of inner coil m3, overlying and insulated from inner coil m2.

A second end 28 of inner coil m3 is connected by lead 30 to a first end 32 of outer coil m3, formed on the same level, and at the same time, as inner coil m3. A conductive via 34 connects a second end 36 of outer coil m3 to a first end 38 of outer coil m2, formed on the same level, and at the same time, as inner coil m2. A conductive via 40 connects a second end 42 of outer coil m2 to a first end 44 of outer coil m1, formed on the same level, and at the same time, as inner coil m1. A second end 46 of outer coil m1 is connected to an output lead 48. Output lead 48 and input lead 11 are connected to any circuit requiring use of an inductor.

As seen, the six coils in FIG. 1 are effectively connected in series, where the serial connections are first made between the inner coils and then made between the outer coils. The inductor 10 of FIG. 1 may also be formed to have input lead 11 and output lead 48 connected to a top level of coils, which is easily visualized by turning FIG. 1 upside down.

The structure of FIG. 1 could easily be modified to have each of the coils be rectangular or square, although circular coils generally provide a higher inductance value.

The concepts described with respect to FIG. 1 may be applied to an inductor with two or more levels of coils, where the interconnections between the coils repeat for each level. In practical embodiments, these levels may range from 2 to 7 or more.

Further, it can easily be seen how three or more coils per level can be serially connected to coils on different levels. For example, for a three coil per level structure, the innermost coils and the middle coils would be serially connected like the inner and outer coils in FIG. 1. The outermost coils would then be serially connected to the lead 48 in FIG. 1. In this case, an input lead would connect to the bottom layer, and the output lead would connect to the top layer. For a four (or any even number) coil per layer structure, the input and output leads would connect to the same level, which is desirable.

Figure 2:
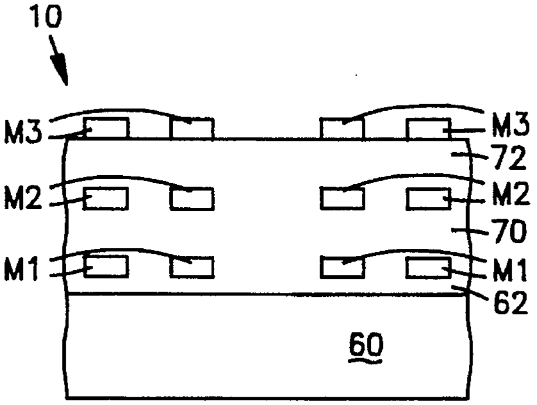
FIG. 2 is a cross-section of an integrated circuit structure bisecting the inductor of FIG. 1.

FIG. 2 is a cross-section of an integrated circuit structure, including a substrate 60, which bisects the inductor 10 of FIG. 1. Circuitry connected to the inductor 10 would also be included on the substrate 60. Substrate 60 may be a semiconductor, such as silicon or gallium arsenide, or may be formed of an insulating material. In one method for forming the structure of FIG. 2, an insulating layer 62 of silicon dioxide or other suitable insulator is deposited on the surface of substrate 60. This step would not be necessary if substrate 60 were sufficiently insulating. A first layer of metal, such as aluminum, is then deposited on the insulating layer 62. Using conventional photolithographic and etching techniques, the metal layer is then patterned to form the inner coil m1 and the outer coil m1 shown in FIG. 1.

Figure 3:
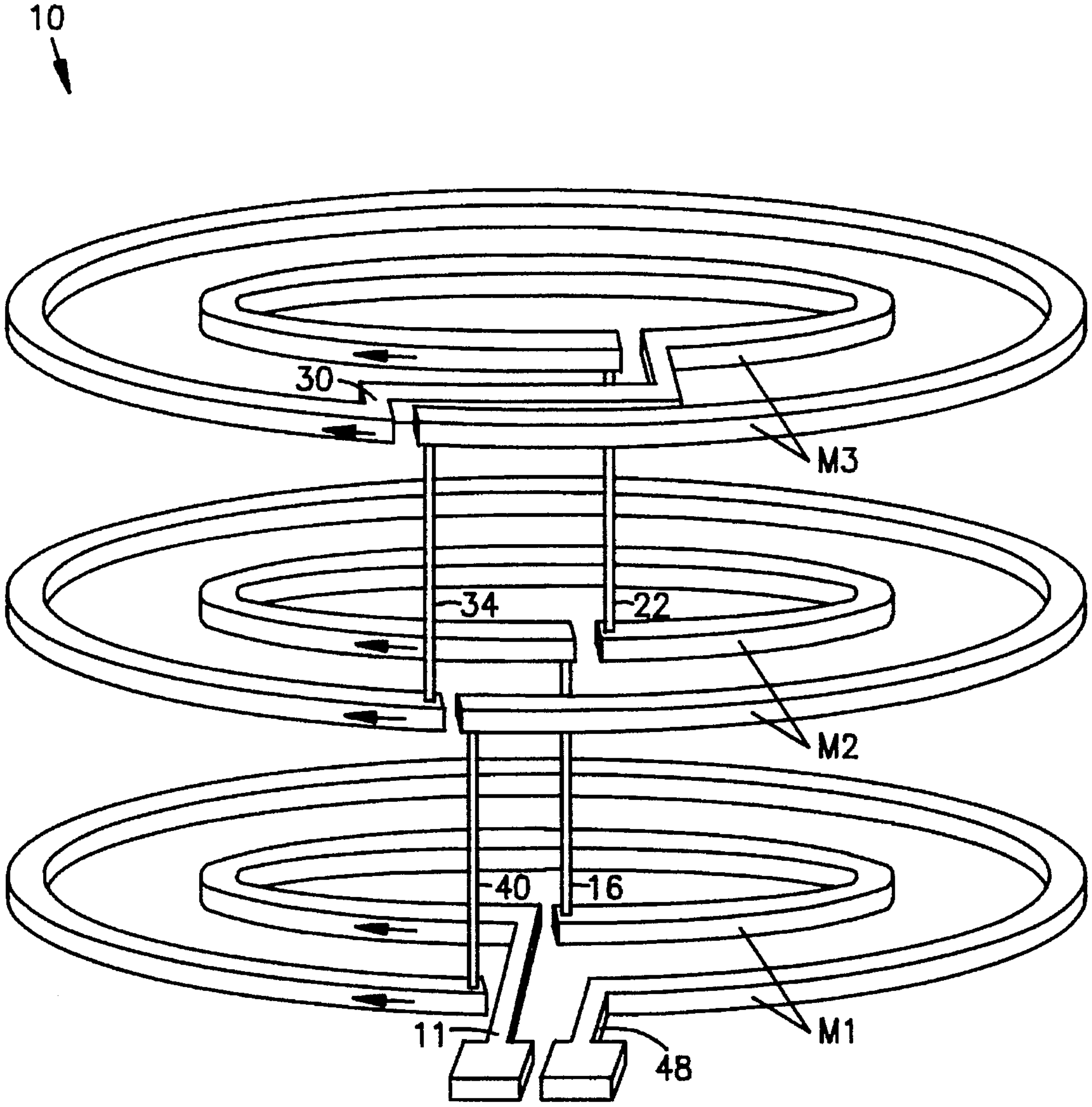
FIG. 3 illustrates the inductor of FIG. 1 with the vias shown and input/output leads formed using the first metal layer.

The input lead 11 and output lead 48 in FIG. 1 are also formed at this time if such leads are formed on the same level as the coils m1. Such leads 11 and 48 are shown in FIG. 3. FIG. 3 also shows one embodiment of the various vias and other connections between the coils rather than the more abstract wiring of FIG. 1. Similarly numbered elements in FIGS. 1 and 3 perform the same function. Note that in FIG. 3 there is no need for a cross-over for input lead 11 to extend beyond the boundary of outer coil m1.

Figure 4:
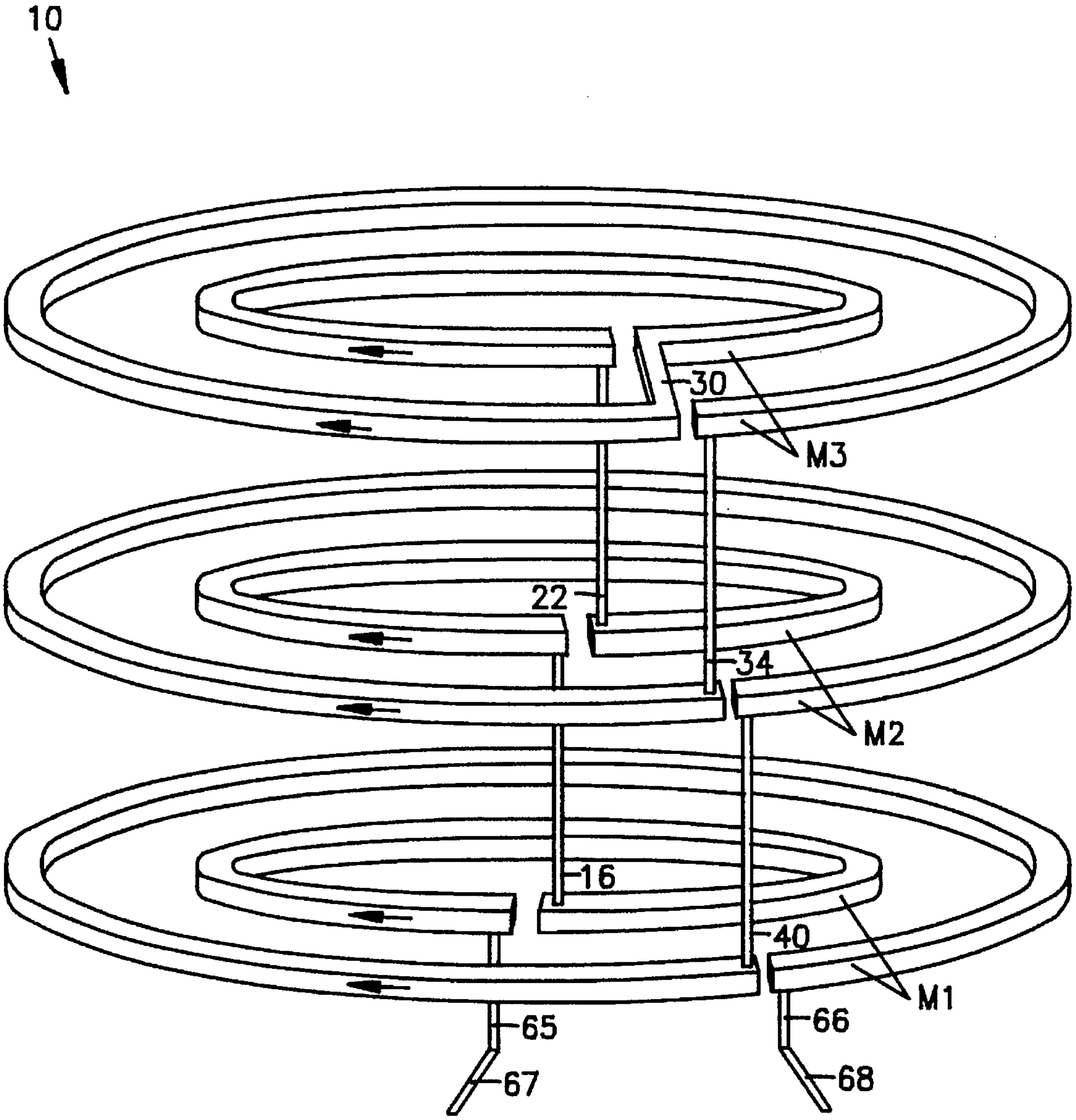
FIG. 4 illustrates the inductor of FIG. 1 with the vias shown and input/output leads formed by doped regions in a substrate.

In another embodiment, shown in FIG. 4, vias 65 and 66 are formed through the insulating layer 62 to connect the ends of inner coil m1 and outer coil m1 to highly doped regions 67 and 68 formed in substrate 60 which extend to contact pads or to other circuitry. A silicide layer may be used to lower the resistivity of the regions 67 and 68. Those skilled in the art would understand the various ways which may be used to interconnect the inductor 10 with other circuits.

Referring back to FIG. 2, a next insulating layer 70 is deposited over coils m1. The various layers of insulation are shown merged since they are the same material. Vias 16 and 40 (FIGS. 3 and 4) are then formed through insulating layer 70 using conventional photolithographic and etching techniques to provide the interconnections between the subsequently formed coils m2 and the coils m1. The conductive material for the vias may be deposited at the same time that the metal for coils m2 is deposited. A second layer of metal is then deposited over the insulating layer 70 and patterned using conventional photolithographic techniques to form coils m2.

A third insulating layer 72 is then deposited over coils m2, and vias 22 and 34 (FIGS. 3 and 4) are suitably formed to connect the subsequently formed coils m3 to the coils m2.

A third metal deposition and patterning step is used to form metal coils m3, which are thus serially connected to coils m1 and m2 in the manner shown in FIG. 1.

Figure 5:
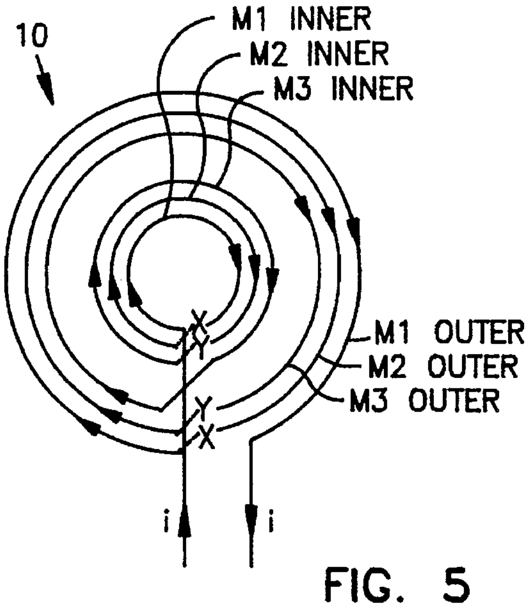
FIG. 5 is a simplified top-down view of the structure of FIG. 1 with the coils in the various layers expanded as necessary to illustrate the structure.

FIG. 5 is a top-down view of the structure shown in FIG. 1 which has been slightly altered to cause the various coils to not overlap so they may be viewed from above. In FIG. 5, each separate coil is identified. Vias are indicated with dashed lines and are identified with an X or a Y. An X indicates a via between levels one and two, and a Y indicates a via between levels two and three.

Connecting the coils of FIG. 1 in series, rather than in parallel, increases the DC resistance of the inductor; however, the series interconnection effectively results in the inductor coil having six turns. Since inductance is related to number of coil turns squared, the inductance of inductor 10 of FIG. 1 is relatively high.

Table I below compares the qualities of the series-connected inductor 10 in FIG. 1, an inductor 76 (FIG. 6) formed as a single, flat coil, and an inductor 78 (FIG. 7) formed using a parallel coil configuration, where the inner coils are connected in parallel and the outer coils are connected in parallel. The physical size of the structures, the pitches between coils on the same level, the metal thickness and the test frequency are identified below Table I.

Figure 6:
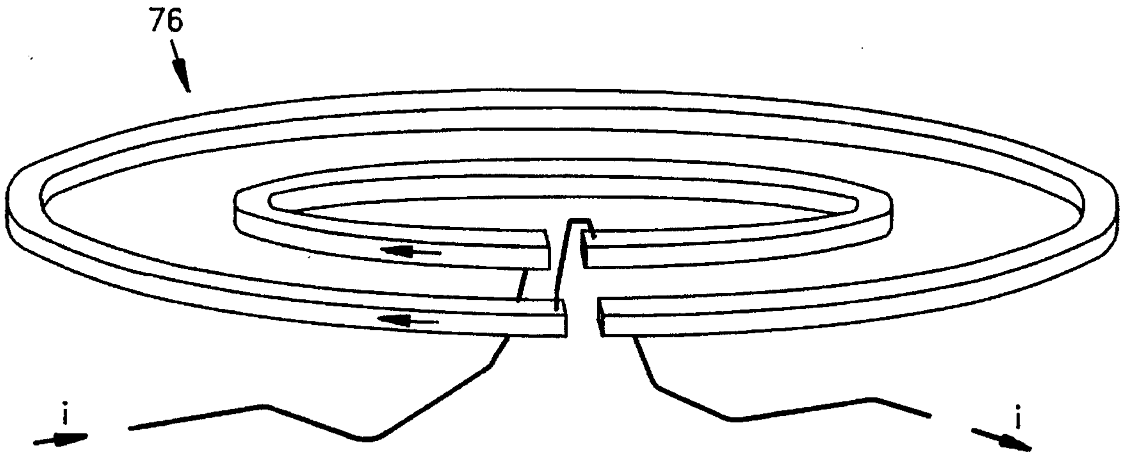
FIGS. 6 and 7 illustrate inductors not in accordance with the present invention but whose performance was compared to that of the inductor of FIG. 1.
Figure 7:
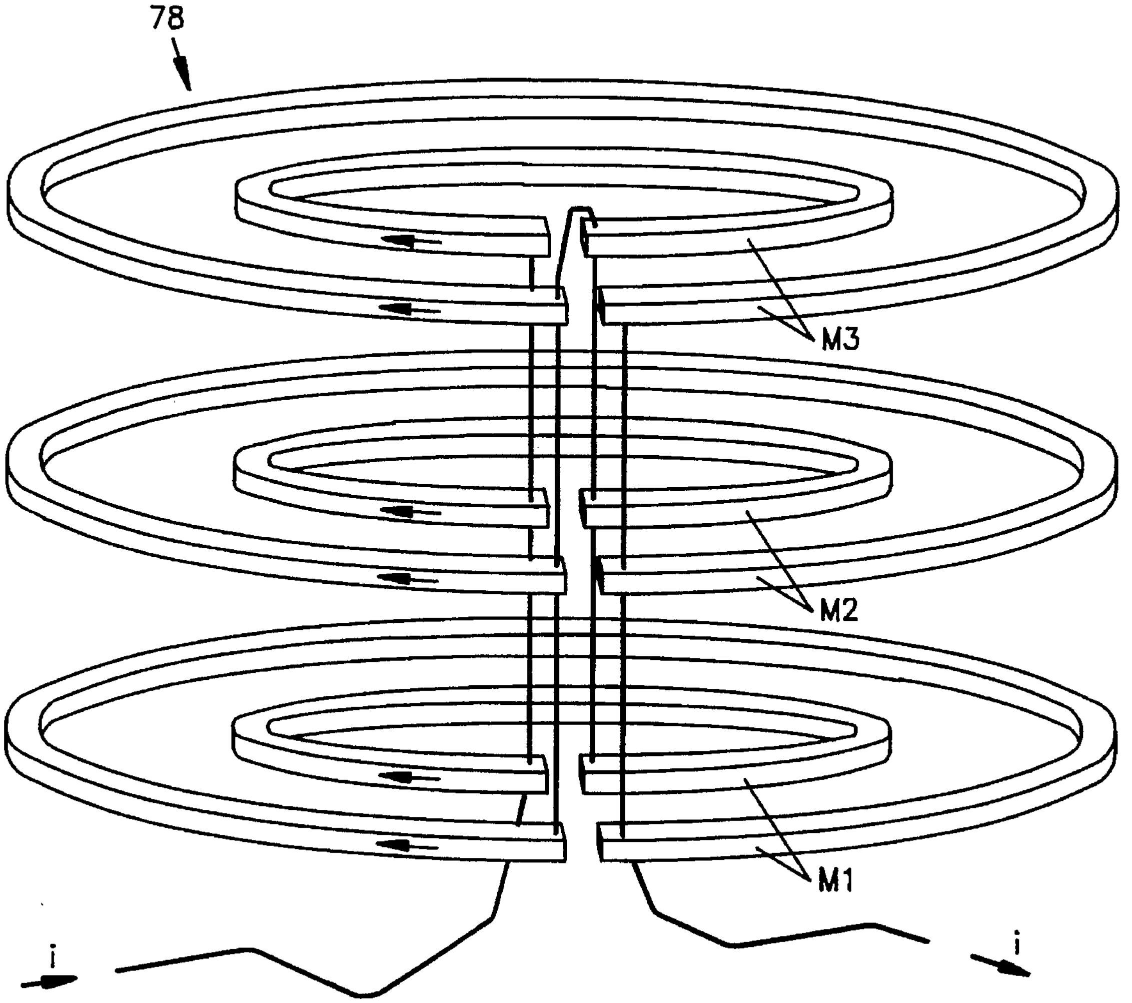

| Inductor type | Resistance | Inductance | L/R | Q |
|---|---|---|---|---|
| Single coil FIG. 6 | 20K ohms | 1.9 mH | .095 | 0.060 |
| Parallel coil FIG. 7 | 8.8K ohms | .8 mH | .090 | 0.057 |
| Series coil FIG. 1 | 60K ohms | 53 mH | .883 | 0.555 |

(1) each test structure area = 1 $mm^2$
(2) m1 = m2 = m3 pitch = 2 um
(3) m1 = 6500 Å, m2 = 6700 Å, m3 = 8800 Å
(4) test frequency = 100 KHz As seen, the resistance of the series-connected coil of FIG. 1 is much greater than the parallel coil and three times greater than the single coil, but the resulting inductance greatly offsets this increase in resistance. The resulting inductance is approximately 28 times that of the single coil. The resulting L/R value and Q factor are almost ten times that of the single coil and the parallel coil. The results of Table 1 are obtained from actual test results.

The series-connected inductor described herein may be formed to have an inductance of virtually any value depending upon how many layers and how coils per layer are used. However, it is generally desirable to form the inductor having the same number of layers as the number of layers already used in the integrated circuit process for forming the remainder of the circuitry, such as an oscillator in a voltage controlled oscillator (VCO) circuit. The inductance value will also be limited by the available real estate on the die. The inductance values shown in Table I are for relatively large inductors formed for test purposes, and a typical value of an inductor in an actual integrated circuit, such as a VCO, will be on the order of tens or hundreds of nanohenrys.

Figure 8:
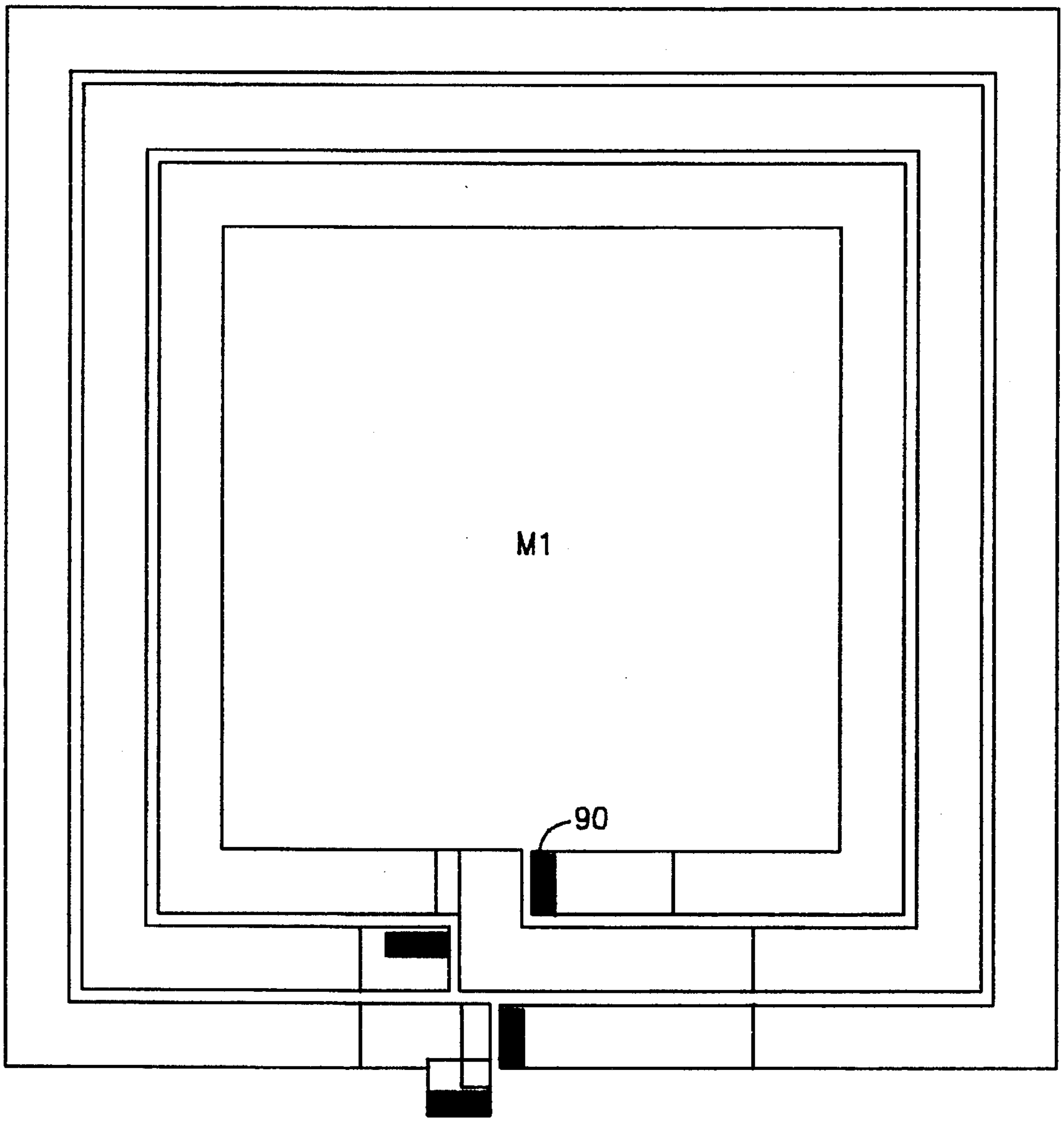
FIGS. 8–10 are plots of the actual metal patterns for an inductor having three layers and three coils per layer.
Figure 9:
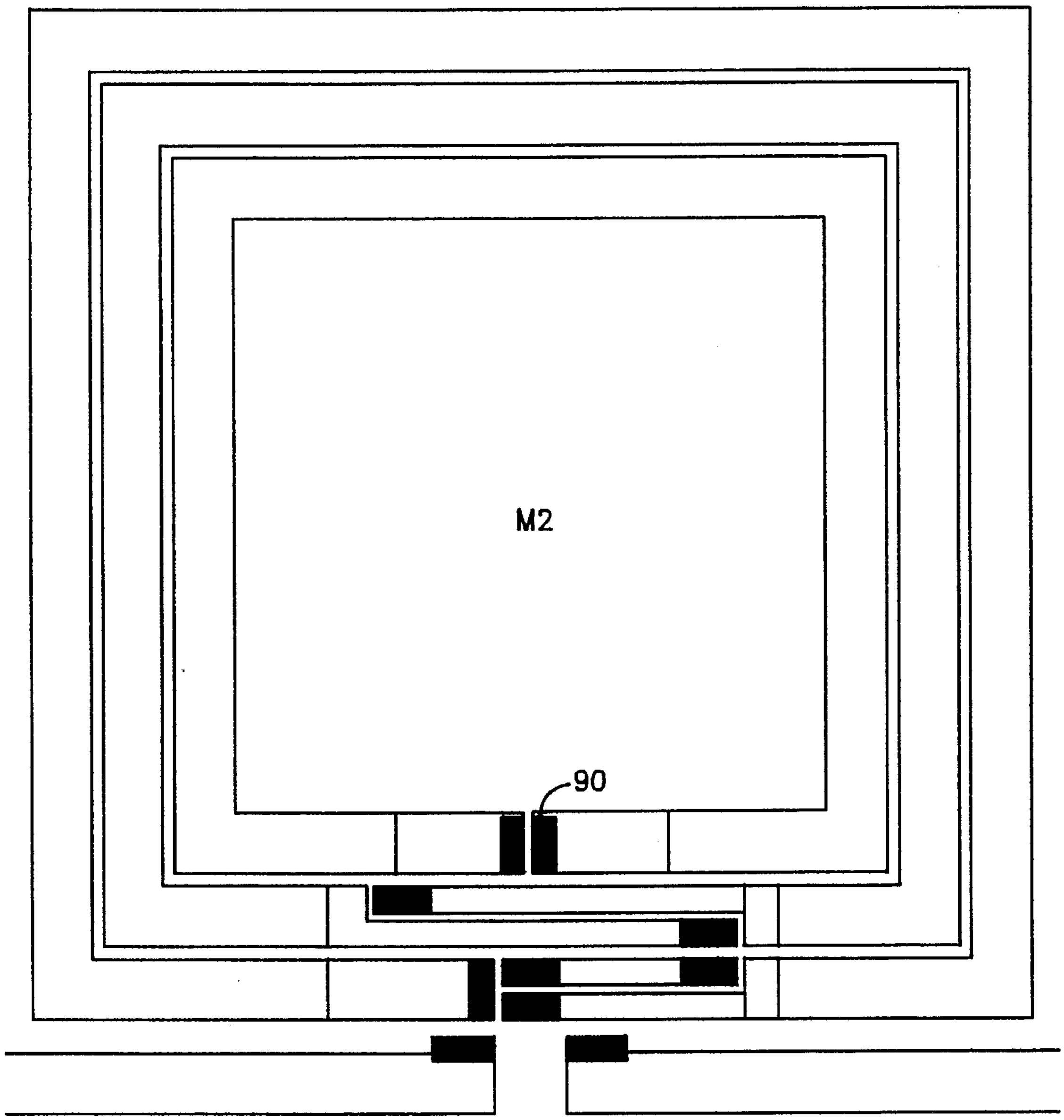
Figure 10:
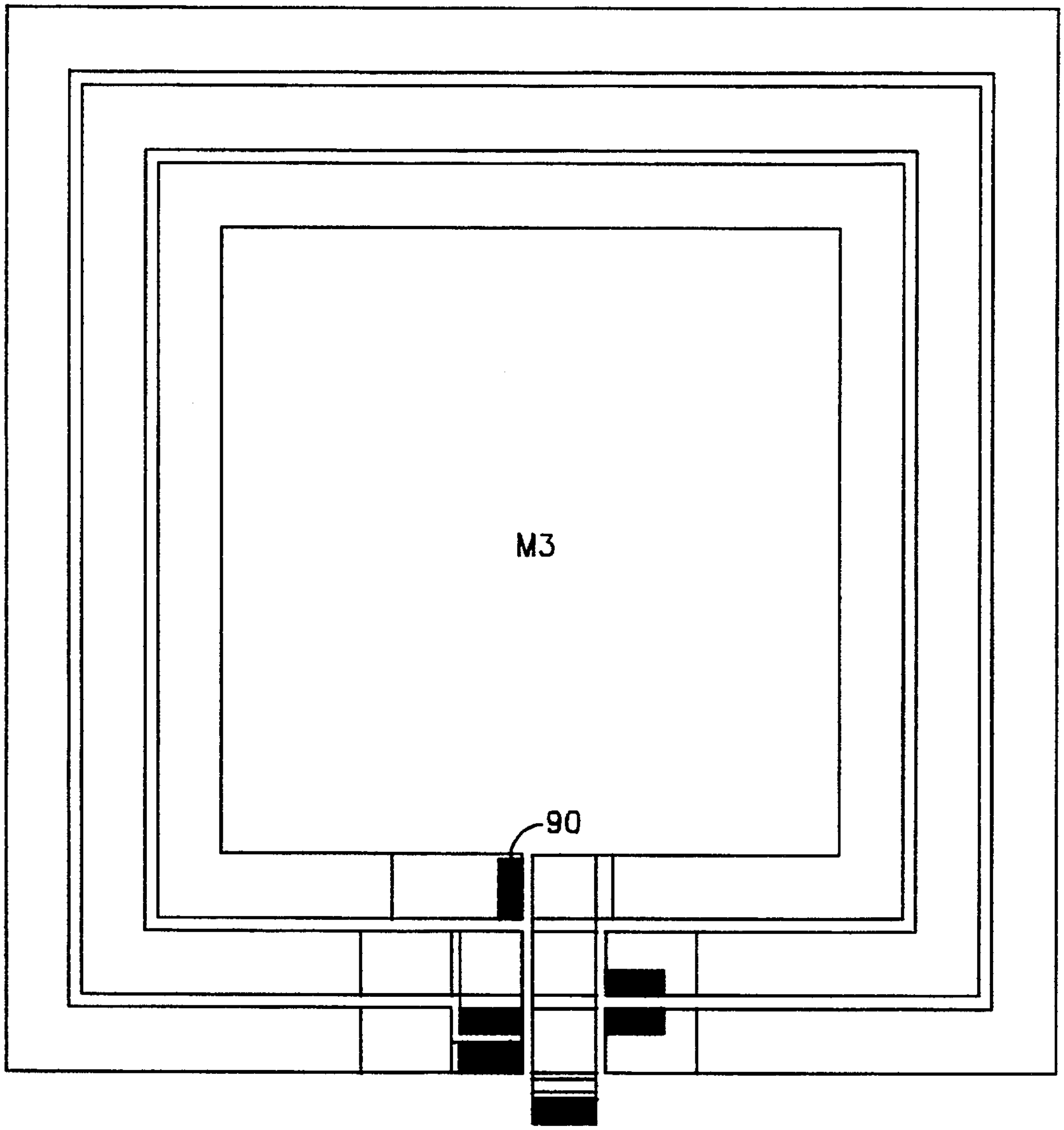

FIGS. 8, 9, and 10 are plots for metal layers M1, M2, and M3, respectively, of a three layer inductor having three coils per level. The via locations for connections between levels are identified with bars 90.

It is to be understood that any coil shape or material used to form an inductor is within the scope of this invention and that the various methods of creating interconnections between the inductor coils and other circuitry on the chip would depend upon the particular application of the inductor.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An inductor formed on a substrate using integrated circuit techniques, said inductor comprising:

a first conductive coil and a second conductive coil formed on a first insulating surface, said first conductive coil being substantially formed within the boundaries of said second conductive coil;

a third conductive coil and a forth conductive coil formed on a second insulating surface, said third conductive coil being substantially formed within the boundaries of said fourth conductive coil;

a fifth conductive coil and a sixth conductive coil formed on a third insulating surface, said fifth conductive coil being substantially formed within the boundaries of said sixth conductive coil, said first conductive coil, said third conductive coil, and said fifth conductive coil being substantially axially aligned, said second conductive coil, said fourth conductive coil, and said sixth conductive coil being substantially axially aligned, a first end of said first conductive coil being connected to a first end of said third conductive coil, a second end of said third conductive coil being connected to a first end of said fifth conductive coil, a second end of said fifth conductive coil being connected to a first end of said sixth conductive coil, a second end of said sixth conductive coil being connected to a first end of said fourth conductive coil, a second end of said fourth conductive coil being connected to a first end of said second conductive coil, a second end of said second conductive coil receiving an input current, and a second end of said first conductive coil providing an output current so as to create a series combination of said first conductive coil, said third conductive coil, said fifth conductive coil, said sixth conductive coil, said fourth conductive coil, and second conductive coil, all connections between conductive coils on different insulating surfaces being made with conductive vias formed through an insulating surface;

a seventh conductive coil formed on said first insulating surface, said first conductive coil and said second conductive coil being substantially formed within the boundaries of said seventh conductive coil;

an eighth conductive coil formed on said second insulting surface, said third conductive coil and said fourth conductive coil being substantially formed within the boundaries of said eighth conductive coil;

a ninth conductive coil formed on said third insulating surface, said fifth conductive coil and said sixth conductive coil being substantially formed within the boundaries of said ninth conductive coil, said seventh conductive coil, said eighth conductive coil, and said ninth conductive coil being substantially axially aligned, a first end of said seventh conductive coil being connected to said second end of said second conductive coil, a first end of said eighth conductive coil being connected to a second end of said seventh conductive coil, a second end of said eighth conductive coil being connected to a first end of said ninth conductive coil, a second end of said ninth conductive coil being connected to receive said input current, said second end of said first conductive coil connected to provide said output current, so as to create a series combination of said first conductive coil, said third conductive coil, said fifth conductive coil, said sixth conductive coil, said fourth conductive coil, said second conductive coil, said seventh conductive coil, said eighth conductive coil, and said ninth conductive coil; and a conductive bridge formed on said second insulating surface connecting said first end of said seventh conductive coil to said second end of said second conductive coil.

2. The inductor of claim 1 further comprising:

a first conductive lead formed on said second insulating surface connected to said second end of said first conductive coil, said first conductive lead providing said output current; and a second conductive lead formed on said second insulating surface connected to said second end of said ninth conductive coil, said second conductive lead receiving said input current.

3. The inductor of claim 1 wherein said conductive bridge has a width dimension and a length dimension, said width dimension being substantially the same as a width dimension of said first end of said eighth conductive coil, a length of said conductive bridge running along side a length of said first end of said eighth conductive coil.

4. The inductor of claim 1 wherein said first conductive coil, said second conductive coil, said third conductive coil, said fourth conductive coil, said fifth conductive coil, said sixth conductive coil, said seventh conductive coil, said eighth conductive coil, and said ninth conductive coil are rectangular.

* * * * *